(12) United States Patent
Nakanishi

(10) Patent No.: US 7,754,563 B2
(45) Date of Patent: Jul. 13, 2010

(54) NANOLAMINATE-STRUCTURE DIELECTRIC FILM FORMING METHOD

(75) Inventor: Naruhiko Nakanishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 96 days.

(21) Appl. No.: 11/776,300

(22) Filed: Jul. 11, 2007

(65) Prior Publication Data

US 2008/0135983 A1 Jun. 12, 2008

(30) Foreign Application Priority Data

Jul. 20, 2006 (JP) ............................. 2006-197546

(51) Int. Cl.
*H01L 21/8242* (2006.01)
*H01L 21/44* (2006.01)
(52) U.S. Cl. ...................... 438/240; 438/680
(58) Field of Classification Search ................. 438/240, 438/680
See application file for complete search history.

(56) References Cited

U.S. PATENT DOCUMENTS

| | | | | |
|---|---|---|---|---|
| 6,911,402 B2* | 6/2005 | Lee et al. | ..................... | 438/763 |
| 6,987,063 B2* | 1/2006 | Adetutu et al. | .............. | 438/685 |
| 2003/0124875 A1* | 7/2003 | Kil | .............................. | 438/785 |
| 2004/0224505 A1* | 11/2004 | Nguyen et al. | .............. | 438/681 |
| 2006/0151823 A1* | 7/2006 | Govindarajan | .............. | 257/310 |

FOREIGN PATENT DOCUMENTS

| | | | |
|---|---|---|---|
| JP | 2004 146559 | | 5/2004 |
| WO | WO 2004042804 A2 | * | 5/2004 |

* cited by examiner

*Primary Examiner*—Ha Tran T Nguyen
*Assistant Examiner*—Aaron A Dehne
(74) *Attorney, Agent, or Firm*—Whitham Curtis Christofferson & Cook, PC

(57) ABSTRACT

Nanolaminate-structure SrO/TiO films are formed on a lower electrode of a capacitor by molecular layer deposition kept in a rate-determined state by a surface reaction. The nanolaminate-structure SrO/TiO films are formed by alternately laminating one or more and 20 or less SrO molecular layers and one or more and 20 or less TiO molecular layers at 150° C. or more and 400° C. or less and at 10 Torr or more and the atmospheric pressure or less. This makes it possible to obtain the nanolaminate-structure SrO/TiO films with a high permittivity and a high coverage and with no occurrence of crystalline foreign substance.

20 Claims, 6 Drawing Sheets

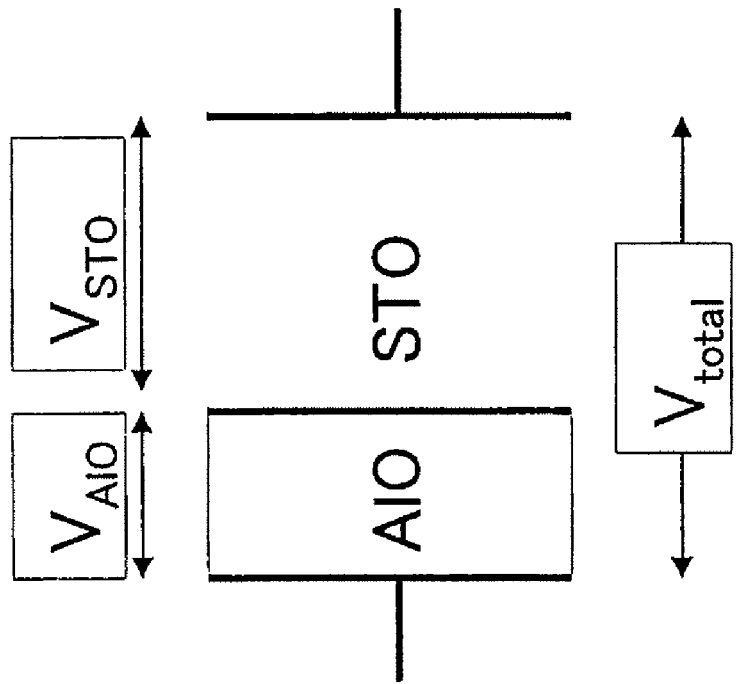
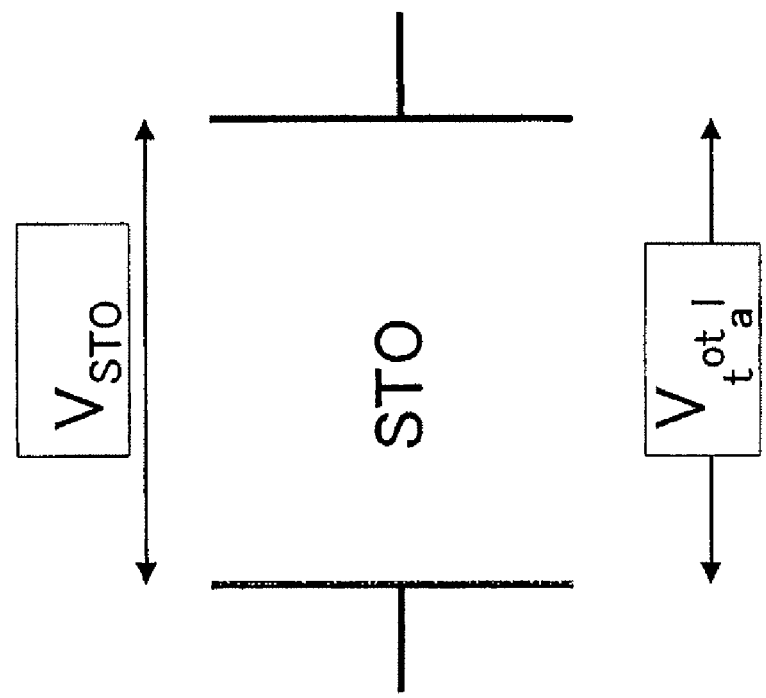
FIG.6B
FIG.6A

NANOLAMINATE-STRUCTURE DIELECTRIC FILM FORMING METHOD

This application is based upon and claims the benefit of priority from Japanese patent application No. 2006-197546, filed on Jul. 20, 2006, the disclosure of which is incorporated herein in its entirety by reference.

BACKGROUND OF THE INVENTION

1. Field of the Invention

This invention relates to a method of forming a nanolaminate-structure dielectric film and, in particular, to a method of forming a nanolaminate-structure dielectric film in the form of a molecular-layer laminate of strontium oxide (SrO) films and titanium oxide (TiO) films.

2. Related Background Art

Recent semiconductor devices have significantly increased in capacity and, in the DRAM (Dynamic Random Access Memory) field, large-capacity memories of 1 Gbit have been put to practical use. DRAM cells each normally comprise one transistor and one capacitor. Charges are stored in the capacitors as memory information and exchanged by the transistors. Each capacitor comprises two electrodes, i.e. a lower electrode connected to a diffusion layer electrode of the transistor and an upper electrode commonly connected to a reference potential, and further comprises a capacitor dielectric film disposed between those electrodes.

In the large-capacity memory, following the reduction in size of each memory cell, the occupation area of a capacitor portion is also reduced. However, in the DRAM, since charges in the capacitors are used as memory information, each capacitor requires a capacitance equal to or greater than a certain value in order to ensure the stable memory operation. As a method of achieving the capacitance equal to or greater than the certain value in the reduced memory cell area, an attempt has been made to reduce the thickness of a capacitor dielectric film or to use a dielectric material film having a high permittivity as a capacitor dielectric film. For example, in the current state, a film thickness of 1 nm or less is required in terms of a silicon oxide ($SiO_2$) film. For this purpose, practical use is made of a dielectric film, such as an aluminum oxide (herein after referred to as "AlO"; relative permittivity: about 9) film or a $Ta_2O_5$ (tantalum pentoxide; relative permittivity: about 50) film, having a higher permittivity than a $SiO_2$ (silicon oxide) film and a $Si_3N_4$ (silicon nitride) film which have hitherto been used. Further, practical use of a $SrTiO_3$ (strontium titanate; hereinafter referred to as "STO") film is also now under review.

As a patent document for the STO film, there is Japanese Unexamined Patent Application Publication (JP-A) No. 2004-146559 (hereinafter referred to as "Patent Document 1") filed by the present inventor. In Patent Document 1, the present inventor obtains a dielectric film having a high relative permittivity (about 150) by depositing a STO film by a CVD method at 420° C. and then heat-treating it at 500° C. or more and 650° C. or less.

SUMMARY OF THE INVENTION

As a result of a detailed analysis of the STO film formed by the CVD method, the present inventor has found that a large number of minute abnormal projections are present on the surface of the STO film. Since these abnormal projections are observed at least immediately after the formation of the STO film, it is obvious that the abnormal projections occur during the film formation. It is conjectured that if there occur locally crystallized portions due to some cause during the film formation, strontium or strontium oxide existing around them moves on the surface to grow into projections, resulting in occurrence of the abnormal projections. These abnormal projections may impede formation of a film to be stacked on the STO film or reduce the reliability of the STO film itself, which is not preferable. On the other hand, following the significant increase in capacity of the DRAMs, a method of manufacturing a higher-coverage, smooth STO film with a reduced thickness has been required in order to achieve the required capacitance of each of the capacitors in the miniaturized memory cells.

Under these circumstances, it is an object of this invention to provide a method of manufacturing a higher-coverage, smooth dielectric film having a high permittivity without forming abnormal projections on the surface thereof.

Further, with respect to a capacitor of a semiconductor device of the design rule 40 nm or subsequent generation and a manufacturing method thereof, it is an object of this invention to provide a capacitor with an EOT ($SiO_2$ film equivalent oxide thickness) of 1 nm or less and with a reduced leakage current and a manufacturing method thereof.

For achieving the foregoing objects, this invention basically employs techniques described below. It is readily understood that applied techniques variously changeable within the scope not departing from the gist of those techniques are also included within the scope of this invention.

As a result of assiduous studies, the present inventor has found that the foregoing objects are effectively achieved by forming a dielectric film by alternately laminating strontium oxide molecular films and titanium oxide molecular films in several layers instead of the conventional CVD method of forming a STO film as a single-layer film and by adjusting the temperature of a semiconductor substrate and the pressure in a reaction chamber as the forming conditions of the dielectric film, and has reached this invention.

According to one aspect of this invention, there is provided a method of forming a dielectric film on a semiconductor substrate held in a reaction chamber and comprises a first molecular layer deposition step of performing molecular layer deposition of a first metal oxide to form a first metal oxide film, and a second molecular layer deposition step of performing molecular layer deposition of a second metal oxide to form a second metal oxide film.

In the dielectric film forming method of this invention, it is preferable that the first metal oxide be strontium oxide and the second metal oxide be titanium oxide.

In the method of forming the dielectric film of this invention, it is preferable that a first dielectric film is further formed on the dielectric film as its lower or upper layer and that the first dielectric film is made of aluminum oxide.

According to another aspect of this invention, there is provided a semiconductor device which includes a capacitor including the dielectric film formed by the foregoing method of forming a dielectric film as a dielectric film of a capacitor.

According to still another aspect of this invention, there is provided a method of manufacturing a capacitor of semiconductor device by using the foregoing method. In the method according to the aspect of the present invention, the strontium oxide is formed by using one of Sr (METHD)$_2$, Sr (THD)$_2$, Sr ($C_5$i-$Pr_3H_2$), and Sr (DPM)2·2 tetraene as a Sr material gas.

According to yet another aspect of this invention, there is provided a method of manufacturing a capacitor of a semiconductor device by using the foregoing method of forming a dielectric film. In the method of the aspect of the present invention, the strontium oxide is formed by using one of Ti (MPD)(THD)$_2$, Ti (O-i-Pr)$_4$, and Ti (O-i-Pr)$_2$(THD) as a Ti material gas.

According to a further aspect of this invention, there is provided a method of manufacturing a capacitor of a semiconductor device by using the foregoing method of forming a dielectric film. In the method, one of O$_2$ plasma, O$_3$, H$_2$O, and H$_2$O plasma as an oxidizing gas.

According to a still further aspect of this invention, there is provide a method of manufacturing a capacitor of semiconductor device by using the foregoing method of forming dielectric film. In the method, the aluminum oxide is formed by atomic layer deposition (ALD).

According to a yet further aspect of this invention, there is provided a method of manufacturing a capacitor of a semiconductor device by using the foregoing metod of forming a dielectric film. In the method, the aluminum oxide is fromed by trimethylaluminum (TMA) as an Al material gas.

According to still another mode of this invention, there is provided a method of manufacturing a capacitor of a semiconductor device by using the foregoing method of forming a dielectric film. In the method, the aluminum oxide is formed by using one of O$_3$, H$_2$O, and O$_2$ plasma as an oxidizing gas.

BRIEF DESCRIPTION OF THE DRAWINGS

FIGS. 6A and 6B are diagrams for explaining a voltage applied to a dielectric film according to an embodiment of this invention;

DESCRIPTION OF THE PREFERRED EMBODIMENTS

Figure 1:
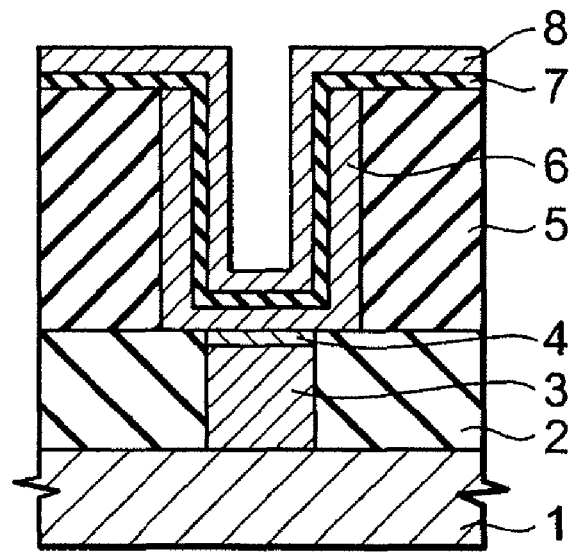
FIG. 1 is a sectional view of a DRAM capacitor according to an embodiment of this invention.

This invention will be described in further detail

As a result of assiduous studies, the present inventor has found that, by alternately laminating strontium oxide molecular films and titanium oxide molecular films in several layers instead of the conventional CVD method of forming a STO film as a single-layer film and by selecting, as forming conditions thereof, conditions such that, for example, the temperature of a semiconductor substrate is 150° C. or more and 400° C. or less and the pressure in a reaction chamber is 10 Torr (1.33×10$^3$ Pa) or more and 760 Torr (1.01×10$^5$ Pa) or less, and more preferably, the temperature is 350° C. or more and 400° C. or less and the pressure is 10 Torr (1.33×10$^3$ Pa) or more and 100 Torr (1.33×10$^4$ Pa) or less, there is obtained a higher-coverage, smooth dielectric film having a high permittivity without forming abnormal projections on the surface thereof and, with respect to a capacitor of a semiconductor device of the design rule 40 nm or subsequent generation and a manufacturing method thereof, it is possible to provide a capacitor with an EOT (SiO$_2$ film equivalent oxide thickness) of 1 nm or less and with a reduced leakage current and a manufacturing method thereof, and has reached this invention.

In addition, in the present invention, the dielectric film formed between the electrode in a semiconductor device will be referred to as the capacitor of the semiconductor device. Referring to the drawings, a description will be given of a method of forming nanolaminate-structure SrO/TiO films according to this invention.

First Embodiment

Figure 3:
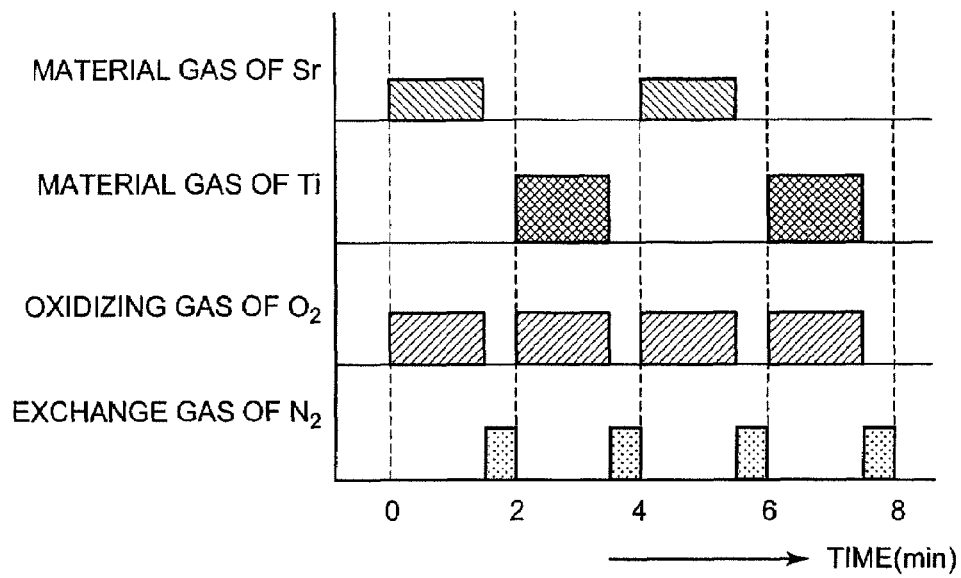
FIG. 3 is a time sequence diagram showing a sequence of supply of material gases and an oxidizing gas according to the embodiment of this invention.
Figure 4:
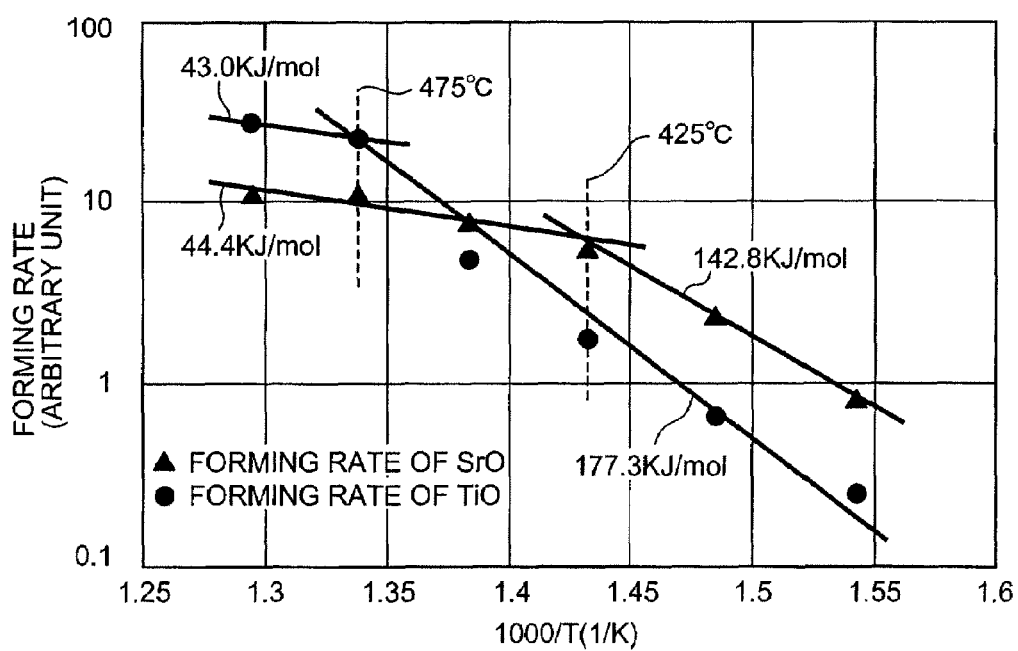
FIG. 4 is an Arrhenius plot diagram showing the forming rates of SrO films and TiO films according to the embodiment of this invention.

The first embodiment of this invention will be described with reference to FIGS. 1 to 4. FIG. 1 is a sectional view of a DRAM capacitor, FIG. 2 is a schematic diagram of an apparatus for forming nanolaminate-structure SrO/TiO films, FIG. 3 is a time sequence diagram showing a sequence of supply of material gases and an oxidizing gas, and FIG. 4 is an Arrhenius plot diagram showing the forming rates of SrO films and TiO films.

The DRAM capacitor shown in FIG. 1 has a three-dimensional cylindrical structure. At first, an interlayer insulating film 2 is formed on a semiconductor substrate 1 by CVD. Then, a polysilicon plug 3 is formed at a predetermined position in the interlayer insulating film 2 by lithography and dry etching. In this event, the polysilicon plug 3 is over-etched so that its upper surface is located below the surface of the interlayer insulating film 2. Then, a barrier metal film 4 is formed on the polysilicon plug 3. The barrier metal film 4 is composed of a titanium silicide film and a titanium nitride film formed thereon. After forming the barrier metal film 4 over the entire surface, the barrier metal film 4 formed on the surface of the interlayer insulating film 2 is removed by CMP (Chemical Mechanical Polishing). Then, an interlayer insulating film 5 is formed on the surfaces of the interlayer insulating film 2 and the barrier metal film 4 by CVD. Then, the interlayer insulating film 5 is formed with a cylindrical hole by lithography and dry etching. The cylindrical hole is a high aspect ratio hole for increasing the capacitor electrode surface area. In this hole, a lower electrode 6 in the form of a Ru (ruthenium) film is formed by a well-known method.

Then, a dielectric film 7 in the form of nanolaminate-structure SrO/TiO films is formed on the lower electrode 6 under the conditions which will be described later. Further, an upper electrode 8 in the form of a Ru film is formed on the dielectric film 7, thereby forming a capacitor. After the formation of the dielectric film 7 or after the formation of the upper electrode 8 on the dielectric film 7, heat treatment can be performed at 500 to 600° C. in an inert atmosphere. Through this heat treatment, it is possible to completely crystallize the nanolaminate-structure SrO/TiO films to thereby realize a relative permittivity of 100 or more. A high band-gap energy dielectric film in the form of an AlO (aluminum oxide) film or the like may be formed between the dielectric film 7 and the lower electrode 6 or between the dielectric film 7 and the upper electrode 8. The lower electrode 6 of the DRAM capacitor formed through the foregoing processes is connected to a diffusion layer of a cell transistor (not shown) through the barrier metal film 4 and the polysilicon plug 3. Incidentally, the semiconductor substrate 1 is formed with, in addition to cell transistors, those components necessary for the configuration of a DRAM.

Figure 2:
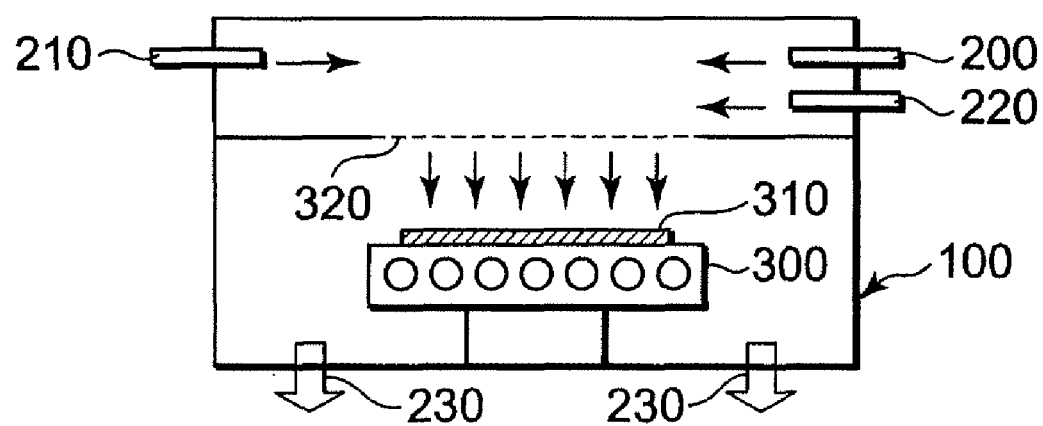
FIG. 2 is a schematic diagram of an apparatus for forming nanolaminate-structure SrO/TiO films according to the embodiment of this invention.

FIG. 2 schematically shows the apparatus for forming the nanolaminate-structure SrO/TiO films according to this invention. Gases are introduced into a reaction chamber 100 through a Sr (strontium) material gas introducing pipe 200, a Ti (titanium) material gas introducing pipe 210, and an oxidizing gas introducing pipe 220, respectively. As the Sr material gas, use is made, for example, of Sr (METHD)$_2$, i.e. (Bis-(Methoxy Ethoxy Tetramethyl Heptane Dionate)-Strontium). As the Ti material gas, use is made, for example, of Ti (MPD) (THD)$_2$, i.e. (Bis (Tetramethyl Heptane Dionate)-(Methyl Pentane Dioxy)-Titanium). Further, use is made, for example, of O$_2$ (oxygen) as the oxidizing gas. Alternatively, use may be made of O$_3$ (ozone), N$_2$O (nitrous oxide), NO (nitrogen monoxide), or the like. Then, the gases are supplied through a shower head 320 to a semiconductor substrate 310 placed on a heater 300. The inside of the reaction chamber 100 is connected to a non-illustrated pump through exhaust ports 230 so as to be maintained at a set pressure.

When forming the nanolaminate-structure SrO/TiO films of this invention, the temperature of the semiconductor substrate 310 is set to 150° C. or more and 400° C. or less and the pressure in the reaction chamber 100 is set to 10 Torr ($1.33\times10^3$ Pa) or more and 760 Torr ($1.01\times10^5$ Pa) or less. In the SrO film formation, the Sr material gas and the oxidizing gas are simultaneously supplied. Instead of the method of simultaneously supplying both gases, use may be made of a method of constantly supplying one of the gases while intermittently supplying the other gas. In the TiO film formation, the Ti material gas and the oxidizing gas are simultaneously supplied. Instead of the method of simultaneously supplying both gases, use may be made of a method of constantly supplying one of the gases while intermittently supplying the other gas. FIG. 3 shows an example of a time sequence in the case where the material gas and the oxidizing gas are simultaneously supplied. When a dielectric film to be formed changes from a SrO film to a TiO film or from a TiO film to a SrO film, N$_2$ (nitrogen) is supplied as an exchange gas. The gas in the reaction chamber 100 is exchanged with the exchange gas. The exchange gas, N$_2$, is introduced into the reaction chamber 100 through the oxidizing gas introducing pipe 220.

FIG. 4 shows the Arrhenius plot diagram showing the forming rates of SrO films and TiO films. The SrO film formation is in the surface reaction limited regime with an activation energy of 142.8 kJ/mol when the temperature is 425° C. or less, while in the gas supply limited regime with an activation energy of 44.4 kJ/mol when the temperature is 425° C. or more. On the other hand, the TiO film formation is in the surface reaction limited regime with an activation energy of 177.3 kJ/mol when the temperature is 475° C. or less, while in the gas supply limited regime with an activation energy of 43.0 kJ/mol when the temperature is 475° C. or more. Therefore, the film formation of the nanolaminate-structure SrO/TiO films on the cylindrical lower electrode achieves high coverage in the temperature ranges where the SrO film forming temperature is 425° C. or less and the TiO film forming temperature is 475° C. or less. Although it is possible to carry out the SrO film formation and the TiO film formation at 150° C. or more, respectively, the temperature is preferably 350° C. or more where the practical film forming rate is obtained. Further, the pressure in the reaction chamber 100 is preferably 10 Torr ($1.33\times10^3$ Pa) or more and 100 Torr ($1.33\times10^4$ Pa) or less.

The dielectric-film nanolaminate-structure SrO/TiO films are formed by alternately laminating one or more and 20 or less SrO molecular layers and one or more and 20 or less TiO molecular layers. It is preferable that each molecular layer be formed thin by depositing one or more and 10 or less molecules in the film thickness direction and more preferably one or more and 3 or less molecules in the film thickness direction. By reducing the number of molecules of each molecular layer in the film thickness direction so as to alternately deposit the SrO films and the TiO films as close to monomolecular layers as possible, it is possible to achieve a high permittivity approximate to that of SrTiO$_3$ (strontium titanate).

By performing the molecular layer deposition in the manner as described above, it is possible to obtain the nanolaminate-structure SrO/TiO films with a higher permittivity and a higher coverage and with no occurrence of abnormal projections.

The abnormal projections each have a diameter of 20 to 100 nm and can be easily observed by a scanning electron microscope. When a single-layer STO film is formed by the CVD method at 420° C. and 0.5 Torr (66.5 Pa) as described in the foregoing Patent Document 1 and then the surface of the formed STO film is observed, about $1\times10^9$/cm$^2$ abnormal projections are confirmed. On the other hand, according to the method of this embodiment, it is possible to obtain a STO film with no abnormal projection at all.

In the nanolaminate-structure dielectric film forming method of this invention, the nanolaminate-structure SrO/TiO films are formed in the wafer temperature ranges where the surface reaction limited regime occurs. The SrO film forming temperature where the surface reaction limited regime occurs is 425° C. or less, while, the TiO film forming temperature where the surface reaction limited regime occurs is 475° C. or less. By the formation in the wafer temperature ranges where the surface reaction limited regime occurs, the high-coverage film can be obtained. It is possible to carry out the SrO film formation and the TiO film formation at 150° C., the lower temperature limit, or more, respectively, while, the practical film forming rate is obtained at 350° C. or more. Further, by setting the pressure in the reaction chamber to 10 Torr ($1.33\times10^3$ Pa) or more and 760 Torr ($1.01\times10^5$ Pa) or less at 400° C. or less in the foregoing high-coverage temperature ranges, the occurrence of abnormal projections can be suppressed. Using dielectric films formed by the forming method of this invention as capacitor dielectric films, the large capacitance is ensured, thereby obtaining a semiconductor device with stable operation.

A semiconductor device of this invention is configured such that dielectric films formed by any of the foregoing dielectric film forming methods are employed as dielectric films of capacitors.

The first embodiment of this invention will be further described with reference to FIGS. 5, 6A and 6B.

According to the nanolaminate-structure dielectric film forming method of this invention, the SrO films and the TiO films are alternately laminated by CVD in the wafer temperature ranges where the surface reaction limited regime occurs, thereby forming the SrO/TiO films. The SrO film forming temperature where the surface reaction limited regime occurs is 425° C. or less, while, the TiO film forming temperature where the surface reaction limited regime occurs is 475° C. or less. By the formation in the wafer temperature ranges where the surface reaction limited regime occurs, the high-coverage film can be obtained. It is possible to carry out the SrO film formation and the TiO film formation at 150° C. or more, respectively, while, the practical film forming rate is obtained at 350° C. or more, which is more preferable.

The nanolaminate-structure SrO/TiO films are formed by alternately laminating one or more and 20 or less SrO molecular layers and one or more and 20 or less TiO molecular layers under the conditions that the temperature of the semiconductor substrate is 150° C. or more and 400° C. or less and the pressure in the reaction chamber is 10 Torr ($1.33\times10^3$ Pa) or more and 760 Torr ($1.01\times10^5$ Pa) or less. This makes it possible to obtain the nanolaminate-structure SrO/TiO films with a high permittivity and a high coverage and with no occurrence of abnormal projections.

Further, with respect to a capacitor of a semiconductor device of the design rule 40 nm or subsequent generation and a manufacturing method thereof, it is an object of this invention to provide a method of manufacturing a capacitor with an EOT ($SiO_2$ film equivalent oxide thickness) of 1 nm or less and with a reduced leakage current.

Figure 5:
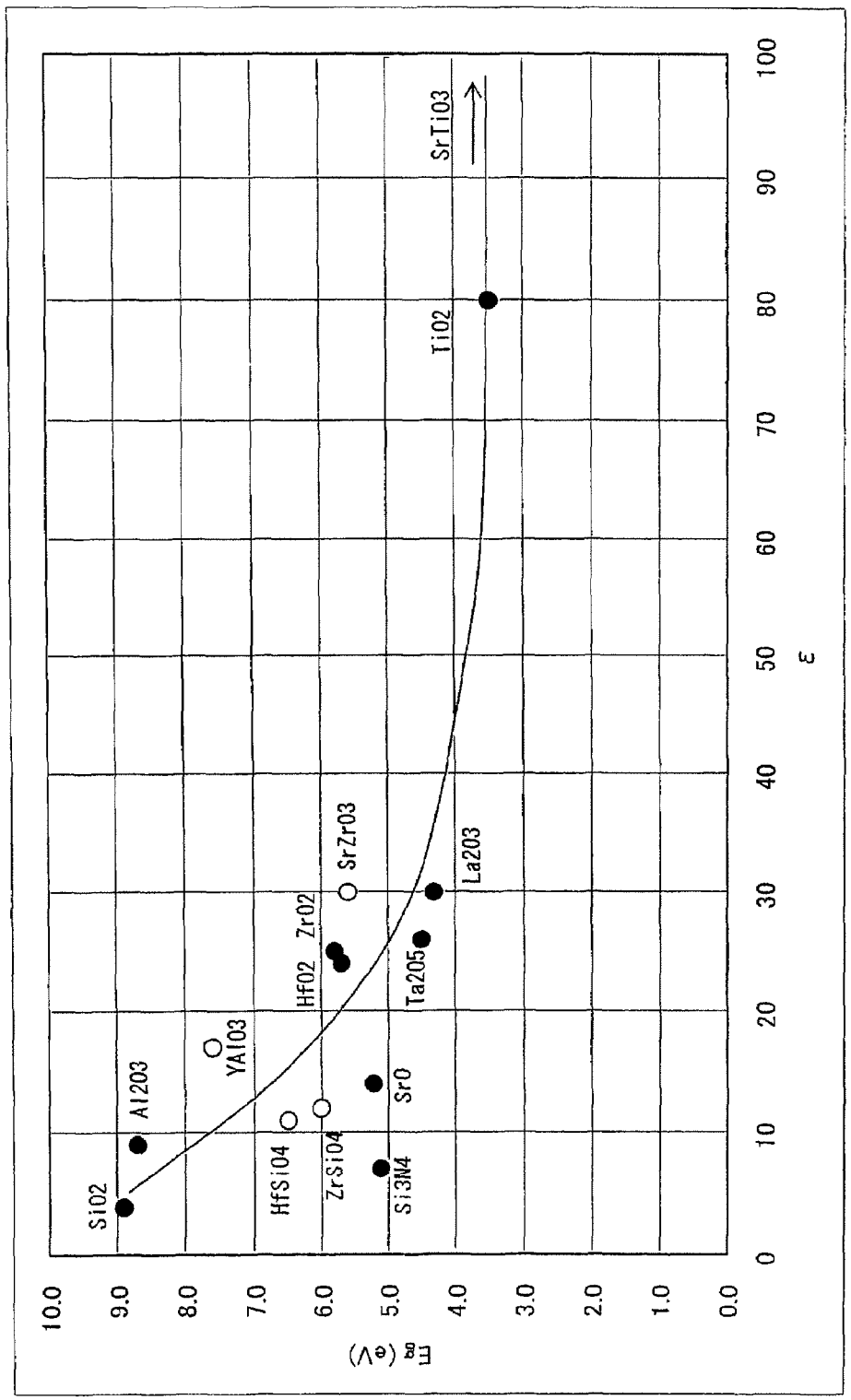
FIG. 5 is a diagram showing a trend between relative permittivities of oxide films and band-gap energies thereof.

FIG. 5 shows a trend between relative permittivities of oxide films and band-gap energies thereof. As shown in FIG. 5, as the relative permittivity of the oxide film increases, its band-gap energy tends to decrease.

The relative permittivity of strontium titanate ($SrTiO_3$) whose crystal structure is a perovskite structure is as large as 100 to 250 and, thus, if it is used as a capacitor insulating film, an EOT ($SiO_2$ film equivalent oxide thickness) of 1 nm or less can be achieved.

On the other hand, since the band-gap energy is as small as 3.3 eV, it is necessary to ensure high reliability to leakage current.

In view of this, a thin film with a high band-gap energy (8.0 eV or more) is used in the form of a laminate with the STO film. For example, AlO (aluminum oxide; relative permittivity: 9) has a high band-gap energy of 8.7 eV and a high breakdown voltage value of about 1E+7V/cm. Therefore, even if an aluminum oxide (AlO) thin film of, for example, 1 nm is used in the form of a laminate with the STO film, no breakage occurs. Accordingly, as shown in FIGS. 6A and 6B, since the voltage applied to the STO film can be reduced as compared with that applied to the STO film used alone, the leakage current can be further reduced. This is the high-reliability property as that of a capacitor dielectric film of a semiconductor device of the design rule 40 nm or subsequent generation.

Second Embodiment

The second embodiment of this invention will be described with reference to FIGS. 7 and 8. A high band-gap energy dielectric film in the form of an AlO (aluminum oxide) film or the like may be formed between the dielectric film 7 and the lower electrode 6 or between the dielectric film 7 and the upper electrode 8 of this invention. The AlO film is formed by atomic layer deposition (ALD).

As an Al material gas, use is made, for example, of trimethylaluminum (TMA). As an oxidizing gas, use is made, for example, of $O_3$. $H_2O$ or $O_2$ plasma may be used instead. With this configuration, there is obtained a capacitor with an EOT ($SiO_2$ film equivalent oxide thickness) of 1 nm or less and with a further reduced leakage current.

Figure 7:
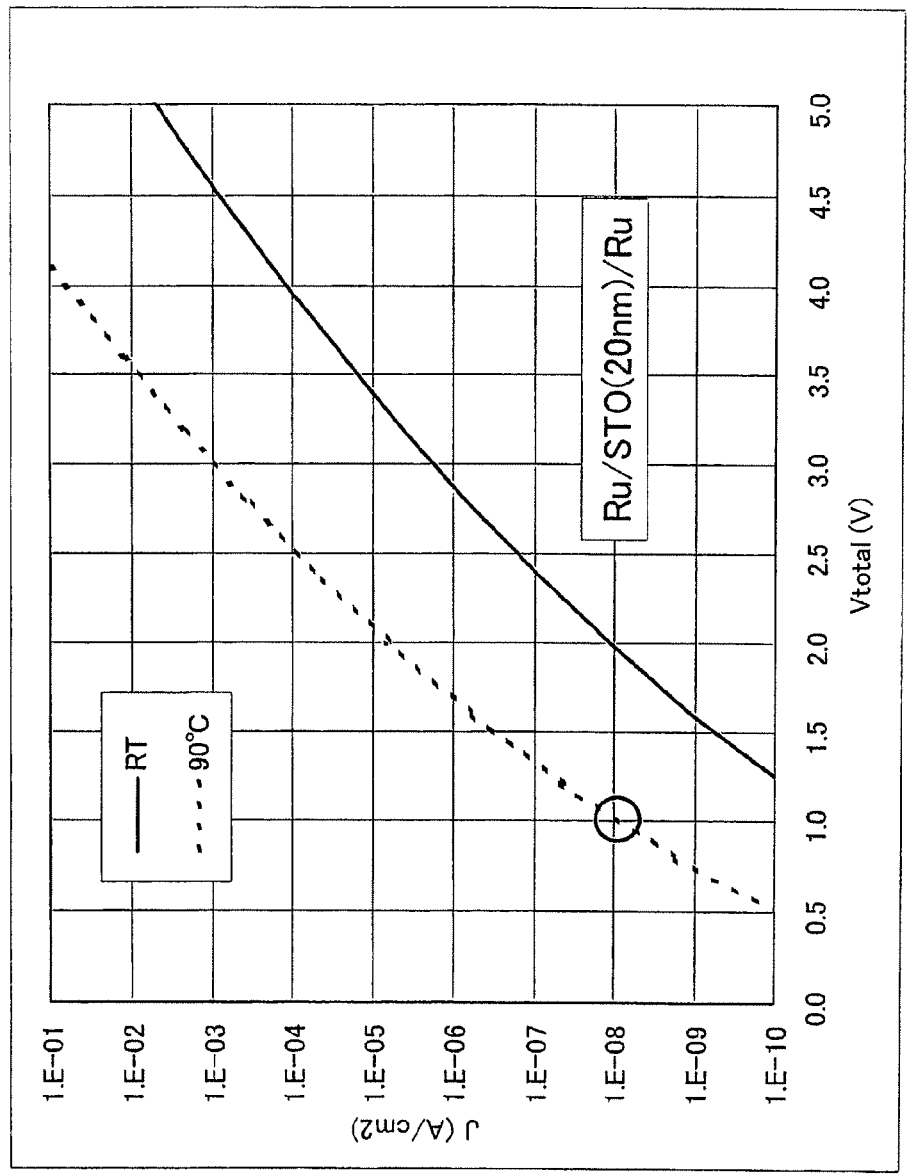
FIG. 7 is a diagram showing leakage currents (Schottky currents) of a dielectric film according to an embodiment of this invention.

FIG. 7 shows leakage currents in the case where a STO film (relative permittivity: 140; thickness: 20 nm) of this invention is used alone as a dielectric film. As shown in FIG. 7, the leakage current at 90° C. becomes $1E-8A/cm^2$ at 1V. FIG. 7 shows only a Schottky current in the leakage current and does not show a leakage current (absorption current) of about 1E-9A observed in a low voltage range of about 1V or less. Further, the EOT ($SiO_2$ film equivalent oxide thickness) becomes 0.56 nm and thus there is obtained a target value of 1 nm or less of a capacitor of a semiconductor device of the design rule 40 nm or subsequent generation.

Figure 8:
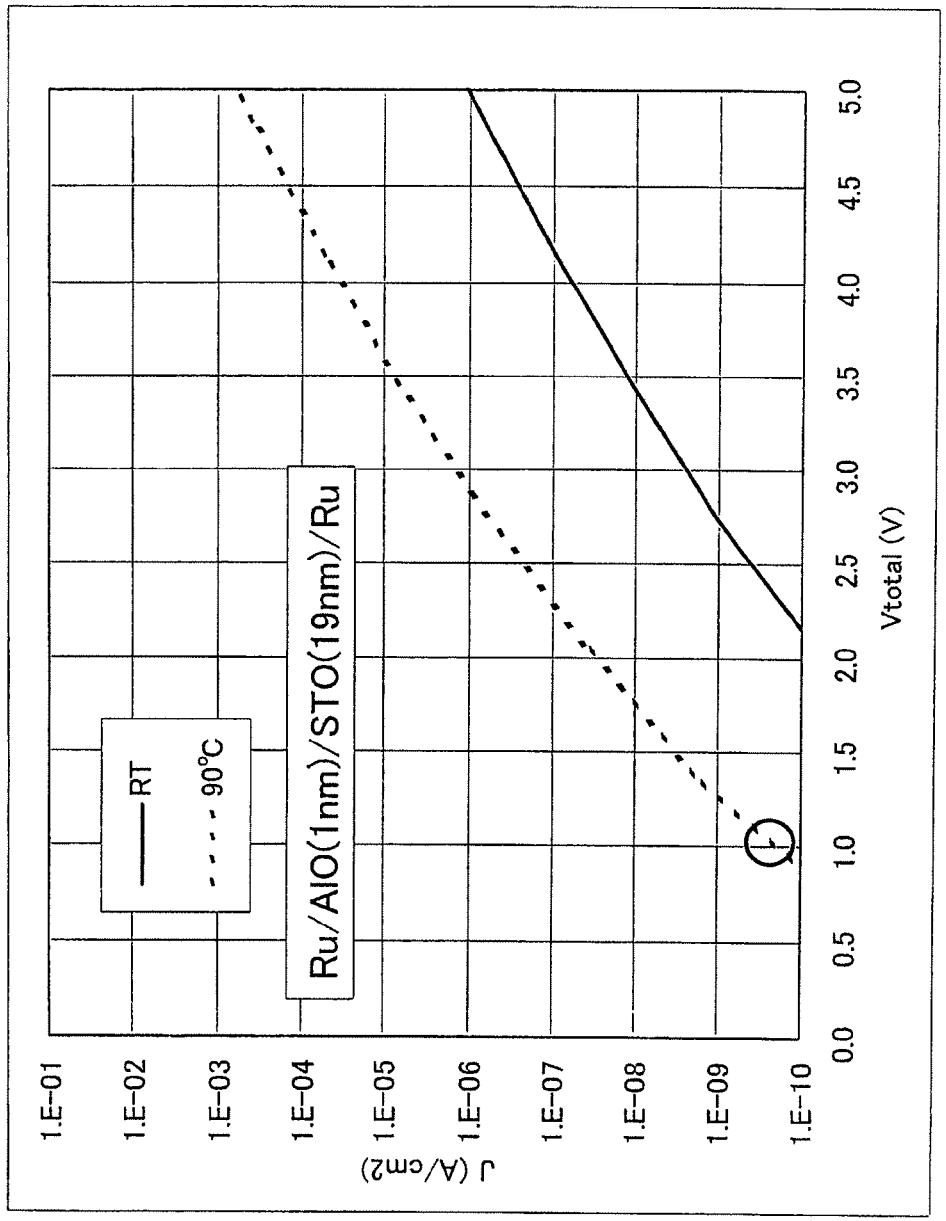
FIG. 8 is a diagram showing leakage currents (Schottky currents) of a laminate-structure dielectric film according to an embodiment of this invention.

FIG. 8 shows leakage currents in the case where, as an application example of this invention, a laminate of a STO film (relative permittivity: 140; thickness: 19 nm) and an aluminum oxide (AlO) film (relative permittivity: 9; thickness: 1 nm) is used as a dielectric film. FIG. 8 shows only a Schottky current in the leakage current and does not show a leakage current (absorption current) of about 1E-9A observed in a low voltage range of about 1V or less. As shown in FIG. 8, the leakage current at 90° C. becomes $1E-9A/cm^2$ or less at 1V and thus can be further reduced as compared with the case where the STO film is used alone, thereby obtaining a high-reliability capacitor. Further, the EOT ($SiO_2$ film equivalent oxide thickness) becomes 0.96 nm and thus there is obtained a target value of 1 nm or less of a capacitor of a semiconductor device of the design rule 40 nm or subsequent generation.

While this invention has been described in terms of the first and second embodiments, the invention is not to be limited thereto, but can be embodied in various ways without departing from the gist of the invention and it is readily understood that those modifications are also included in this invention. For example, the SrO films and the TiO films are used as the metal oxide films and are respectively deposited as the molecular layers in the foregoing embodiment, but this invention is not particularly limited to the SrO films and the TiO films and other metal oxide films may be used.

What is claimed is:

1. A method of forming a dielectric film on a semiconductor substrate held in a reaction chamber, the method comprising:

repeating, a plurality of times, a sequence of steps comprising a first deposition step, a first purging step, a second deposition step and a second purging step in that order, to form a dielectric film having a predetermined thickness:

the first deposition step performing molecular layer deposition to form a first metal oxide film by simultaneously supplying a first metal material gas and an oxidizing gas to the reaction chamber;

the first purging step of purging the first metal material gas and the oxidizing gas out of the reaction chamber;

the second deposition step performing molecular layer deposition to form a second metal oxide film by simultaneously supplying a second metal material gas and an oxidizing gas to the reaction chamber; and the second purging step of purging the second metal material gas and the oxidizing gas out of the reaction chamber.

2. The method according to claim 1, wherein said first and second molecular layer deposition steps each perform the molecular layer deposition kept in a rate-determined state by surface reaction.

3. The method according to claim 1, wherein said first and second deposition steps each deposit one or more and 10 or less molecules in a film thickness direction to form a molecular layer.

4. The method according to claim 1, wherein said first and second deposition steps are alternately repeated to form one or more and 20 or less molecular layers of said first metal oxide and one or more and 20 or less molecular layers of said second metal oxide.

5. The method according to claim 1, wherein said first metal oxide is strontium oxide and said second metal oxide is titanium oxide.

6. The method according to claim 5, wherein the strontium oxide film is formed under conditions such that a temperature of said semiconductor substrate is from about 150° C. to about 425° C. and a pressure in said reaction chamber is from about $1.33\times10^3$ Pa to about and $1.01\times10^5$ Pa.

7. The method according to claim 5, wherein the titanium oxide film is formed under conditions such that a temperature of said semiconductor substrate is from about 150° C. to about 475° C. and a pressure in said reaction chamber is from about $1.33 \times 10^3$ Pa to about $1.01 \times 10^5$ Pa.

8. The method according to claim 5, wherein the strontium oxide film and the titanium oxide film are each formed under conditions such that a temperature of said semiconductor substrate is from about 150° C. to about 400° C. and a pressure in said reaction chamber is from about $1.33 \times 10^3$ Pa to about $1.01 \times 10^5$ Pa.

9. The method according to claim 5, wherein the strontium oxide film and the titanium oxide film are each formed under conditions such that a temperature of said semiconductor substrate is from about 350° C. to about 400° C. and a pressure in said reaction chamber is from about $1.33 \times 10^3$ Pa to about $1.33 \times 10^4$ Pa.

10. The method according to claim 1, further comprising forming a first dielectric film on said dielectric film as its lower or upper layer.

11. The method according to claim 10, wherein said first dielectric film is made of aluminum oxide.

12. A semiconductor device comprising a capacitor which includes the dielectric film formed by the method according to claim 1.

13. A method of manufacturing a capacitor of a semiconductor device by using the method according to claim 5, wherein said strontium oxide is formed by using one of Sr $(METHD)_2$, Sr $(THD)_2$, Sr $(C_5-Pr_3H_2)$, and Sr (DPM) 2.2tetraene is used as a Sr material gas.

14. A method of manufacturing a capacitor of a semiconductor device by using the method according to claim 5, wherein said titanium oxide is formed by one of Ti (MPD)$(THD)_2$, Ti $(O-i-Pr)_4$, and Ti (O-i-Pr)2(THD) as a Ti material gas.

15. A method of manufacturing a capacitor of a semiconductor device by using the method according to claim 1, wherein one of $O_2$ plasma, $O_3$, $H_2$, and $H_2O$ plasma is used as an oxidizing gas.

16. A method of manufacturing a capacitor of a semiconductor device by using the method according to claim 11, wherein said aluminum oxide is formed by atomic layer deposition (ALD).

17. A method of manufacturing a capacitor of a semiconductor device by using the method according to claim 11, wherein said aluminum oxide is formed by using trimethylaluminum (TMA) as an Al material gas.

18. A method of manufacturing a capacitor of a semiconductor device by using the method according to claim 11, wherein said aluminum oxide is formed by using one of $O_3$, $H_2O$, and O2 plasma as an oxidizing gas.

19. A method of manufacturing a capacitor of a semiconductor device by using the method according to claim 1, wherein $O_2$ is used as an oxidizing gas.

20. A method of manufacturing a capacitor of a semiconductor device according to claim 12, wherein, after the formation of at least one of the dielectric film and an upper electrode, a heat treatment is performed at 500° C. to 600° C. in an inert atmosphere.

* * * * *